United States Patent
Kim et al.

(10) Patent No.: US 8,258,408 B2
(45) Date of Patent: Sep. 4, 2012

(54) ELECTROMAGNETIC INTERFERENCE NOISE REDUCTION BOARD USING ELECTROMAGNETIC BANDGAP STRUCTURE

(75) Inventors: Han Kim, Yongin-si (KR); Mi-Ja Han, Junjoo-si (KR); Dae-Hyun Park, Woolsan-si (KR); Hyo-Jic Jung, Daejeon-si (KR); Kang-Wook Bong, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 367 days.

(21) Appl. No.: 12/654,545

(22) Filed: Dec. 22, 2009

(65) Prior Publication Data
US 2011/0031007 A1 Feb. 10, 2011

(30) Foreign Application Priority Data
Aug. 10, 2009 (KR) .................. 10-2009-0073444

(51) Int. Cl.
*H05K 9/00* (2006.01)
(52) U.S. Cl. ........ 174/256; 174/250; 174/255; 361/763; 361/777; 361/780; 257/532; 257/665; 343/700 MS; 343/756; 333/206
(58) Field of Classification Search ............ 174/25–267, 174/359, 360, 390, 392; 361/760–767, 738, 361/748, 118, 780–785, 790–795, 816, 818; 333/167, 168, 185, 12, 22 R, 202–205, 236, 333/238, 245, 247; 343/700 MS, 795, 909; 257/192, 532, 665–668, 678, 686, 698, 697, 257/533, 621, 664; 438/605–618, 687, 780
See application file for complete search history.

(56) References Cited

U.S. PATENT DOCUMENTS

| | | | | |
|---|---|---|---|---|
| 5,592,391 A | * | 1/1997 | Muyshondt et al. | 174/260 |
| 6,002,593 A | * | 12/1999 | Tohya et al. | 361/765 |
| 6,091,310 A | * | 7/2000 | Utsumi et al. | 333/12 |
| 6,104,258 A | * | 8/2000 | Novak | 333/22 R |

(Continued)

FOREIGN PATENT DOCUMENTS

JP 6-53351 2/1994

(Continued)

OTHER PUBLICATIONS

Japanese Office Action issued Oct. 25, 2011 in corresponding Japanese Patent Application 2009-293154.

(Continued)

*Primary Examiner* — Michail V Datskovskiy

(57) ABSTRACT

As a multi-layered board, an EMI noise reduction board, having an electromagnetic bandgap structure with band stop frequency properties inserted into an inner portion of the board, includes a first area, in which a ground layer and a power layer are formed, and a second area, placed on a side surface of the first area, in which it has the electromagnetic bandgap structure formed therein so as to shield an EMI noise radiated to the outside through the side surface of the first area. The electromagnetic bandgap structure includes a plurality of first conductive plates, placed along the edge of the board, a plurality of second conductive plates, disposed on a planar surface that is different from the first conductive plates such that the second conductive plates are alternately disposed with the first conductive plates, and a via, which connects the first conductive plates to the second conductive plates.

7 Claims, 27 Drawing Sheets

U.S. PATENT DOCUMENTS

| | | | | |
|---|---|---|---|---|
| 6,198,362 | B1* | 3/2001 | Harada et al. | 333/12 |
| 6,215,372 | B1* | 4/2001 | Novak | 333/12 |
| 6,329,604 | B1* | 12/2001 | Koya | 174/255 |
| 6,353,540 | B1* | 3/2002 | Akiba et al. | 361/794 |
| 6,476,771 | B1* | 11/2002 | McKinzie, III | 343/756 |
| 6,483,481 | B1* | 11/2002 | Sievenpiper et al. | 343/909 |
| 6,512,181 | B2* | 1/2003 | Okubo et al. | 174/255 |
| 6,798,666 | B1* | 9/2004 | Alexander et al. | 361/766 |
| 6,897,831 | B2* | 5/2005 | McKinzie et al. | 343/909 |
| 6,933,895 | B2* | 8/2005 | Mendolia et al. | 343/702 |
| 6,937,480 | B2* | 8/2005 | Iguchi et al. | 361/780 |
| 6,967,282 | B2* | 11/2005 | Tonomura et al. | 174/392 |
| 6,995,733 | B2* | 2/2006 | Waltho | 343/909 |
| 7,016,198 | B2* | 3/2006 | Fessler et al. | 361/780 |
| 7,190,315 | B2* | 3/2007 | Waltho | 343/705 |
| 7,215,007 | B2* | 5/2007 | McKinzie et al. | 257/664 |
| 7,253,788 | B2* | 8/2007 | Choi et al. | 343/909 |
| 7,428,155 | B2* | 9/2008 | Nakao | 361/794 |
| 7,466,560 | B2* | 12/2008 | Hayashi et al. | 361/784 |
| 7,528,788 | B2* | 5/2009 | Dunn et al. | 343/795 |
| 7,586,444 | B2* | 9/2009 | Berlin et al. | 343/700 MS |
| 7,594,105 | B2* | 9/2009 | Ohsaka | 713/2 |
| 7,626,216 | B2* | 12/2009 | McKinzie, III | 257/192 |
| 7,675,729 | B2* | 3/2010 | Anthony et al. | 361/118 |
| 7,764,149 | B2* | 7/2010 | Han et al. | 333/204 |
| 7,843,702 | B2* | 11/2010 | Choi et al. | 361/763 |
| 7,847,739 | B2* | 12/2010 | Achour et al. | 343/700 MS |
| 7,889,134 | B2* | 2/2011 | McKinzie et al. | 343/700 MS |
| 7,944,320 | B2* | 5/2011 | Han et al. | 333/12 |
| 8,004,369 | B2* | 8/2011 | Kwon et al. | 333/12 |
| 8,102,219 | B2* | 1/2012 | Koo et al. | 333/12 |
| 8,125,290 | B2* | 2/2012 | Wu et al. | 333/12 |
| 2005/0104678 | A1* | 5/2005 | Shahparnia et al. | 333/12 |
| 2005/0205292 | A1* | 9/2005 | Rogers et al. | 174/255 |
| 2006/0050491 | A1* | 3/2006 | Hayashi et al. | 361/760 |
| 2006/0092093 | A1* | 5/2006 | Choi et al. | 343/909 |
| 2007/0001926 | A1* | 1/2007 | Waltho | 343/909 |
| 2007/0090398 | A1* | 4/2007 | McKinzie, III | 257/192 |
| 2007/0136618 | A1* | 6/2007 | Ohsaka | 713/323 |
| 2007/0228578 | A1* | 10/2007 | Chou | 257/774 |
| 2009/0011922 | A1* | 1/2009 | de Rochemont | 501/137 |
| 2009/0038840 | A1* | 2/2009 | Kim et al. | 174/376 |
| 2009/0039984 | A1* | 2/2009 | Kim et al. | 333/212 |
| 2009/0040741 | A1* | 2/2009 | Hayashi et al. | 361/794 |
| 2009/0071709 | A1* | 3/2009 | Han et al. | 174/360 |
| 2009/0080172 | A1* | 3/2009 | Arslan et al. | 361/816 |
| 2009/0135570 | A1* | 5/2009 | Chou et al. | 361/782 |
| 2009/0145646 | A1* | 6/2009 | Han et al. | 174/260 |
| 2009/0160578 | A1* | 6/2009 | Achour | 333/175 |
| 2009/0184782 | A1* | 7/2009 | Koo et al. | 333/204 |
| 2009/0236141 | A1* | 9/2009 | Kim et al. | 174/360 |
| 2009/0267704 | A1* | 10/2009 | Chang et al. | 333/175 |
| 2009/0278626 | A1* | 11/2009 | Lee | 333/185 |
| 2009/0315648 | A1* | 12/2009 | Toyao | 333/238 |
| 2009/0322450 | A1* | 12/2009 | Kim et al. | 333/204 |
| 2010/0108373 | A1* | 5/2010 | Park | 174/376 |

FOREIGN PATENT DOCUMENTS

| | | | |
|---|---|---|---|
| JP | 409205290 A | * | 8/1997 |
| KR | 10-0969660 | | 7/2010 |

OTHER PUBLICATIONS

Korean Office Action issued Feb. 1, 2011 in corresponding Korean Patent Application 10-2009-0073444.

* cited by examiner

ELECTROMAGNETIC INTERFERENCE NOISE REDUCTION BOARD USING ELECTROMAGNETIC BANDGAP STRUCTURE

CROSS-REFERENCE TO RELATED APPLICATIONS

This application claims the benefit of Korean Patent Application No. 10-2009-0073444, filed with the Korean Intellectual Property Office on Aug. 10, 2009, the disclosure of which is incorporated herein by reference in its entirety.

BACKGROUND

1. Technical Field

The present invention relates to a board, more specifically to a noise reduction board that can reduce an electromagnetic interference (EMI) noise by using an electromagnetic bandgap structure.

2. Description of the Related Art

As the operating frequencies of electronic products become higher, electromagnetic interference (EMI) has been perceived as a chronic noise problem. Particularly, the operating frequencies of electronic products have reached a few ten MHz, or even a few GHz, making the EMI problems more serious. Subsequently, finding a solution to the problems is desperately needed. Among the EMI problems occurring at a board, a solution for the noise problems particularly occurred at the edge of the board has not been sufficiently researched, making it difficult to completely block the noise at the board.

EMI noise refers to a noise that creates a noise problem caused by interference when an electromagnetic (EM) wave generated in one electronic circuit, component or part is transferred to another electronic circuit, component or part. The EMI noise can be broadly categorized into two types, namely radiation noise (reference numerals 10 and 30 in FIG. 1) and conduction noise (reference numeral 20 in FIG. 1).

The radiation noise 10, which is radiated towards an upper side of the board (that is, the mounting surface of an electronic part), may be commonly shielded by covering an upper portion of the board by use of an electromagnetic shielding cap, for example, a metal cap. However, few studies have tried to find an effective solution for the radiation noise 30 (hereinafter, referred to as an "edge noise"), which is radiated towards the outside of the board when a conduction noise 20 inside the board is conducted to the edge of the board.

If a technology were developed to reduce the edge noise at the edge of the board through a simple modification of the board structure, it would significantly reduce the development time and costs, compared to the conventional method, which solves the problem through the use of a metal cap or a circuit. Additionally, such technology can have more merits in terms of space utilization and power consumption, and can easily remove a noise in a frequency band of a few GHz, making it effective in solving the EMI noise problem at the edge of the board.

SUMMARY

The present invention provides an EMI noise reduction printed circuit board that can shield the radiation noise radiated from an edge of a printed circuit board by inserting an electromagnetic bandgap structure capable of blocking a noise ranging a certain frequency band into a portion of the board corresponding to the edge of the board.

The present invention also provides an EMI noise reduction printed circuit board that has advantages in space utilization, production cost and power consumption, by simply modifying the structure of the board so as to easily shield the radiation noise radiated from the edge of the board.

Other problems that the present invention solves will become more apparent through the following embodiments described below.

An aspect of the present invention provides an EMI noise reduction printed circuit board, which has an electromagnetic bandgap structure with band stop frequency properties inserted into an inner portion of the board and is a multi-layered printed circuit board. The EMI noise reduction printed circuit board includes a first area, in which a ground layer and a power layer are formed, and a second area, which is placed on a side surface of the first area and has the electromagnetic bandgap structure formed therein so as to shield an EMI noise radiated to the outside of the board through the side surface of the first area. Here, the electromagnetic bandgap structure includes a plurality of first conductive plates, which are placed along the side surface of the first area, a plurality of second conductive plates, which are disposed on a planar surface that is different from the first conductive plates such that the second conductive plates are alternately disposed with the first conductive plates, and a via, which connects the first conductive plates to the second conductive plates.

The first area and the second area can be formed as a multi-layered structure having at least four layers, and the via can be a penetration via penetrating through the second area vertically.

Also, the via can be a blind via.

At least one of the first conductive plates and the second conductive plates can have a bent shape corresponding to the shape of the edge of the first area, and at least one adjacent pair of the plurality of first conductive plates can be electrically connected to each other through a connection line.

The first conductive plates can be electrically connected to the ground layer through an access line, and the second area can be selectively disposed only on a portion of the side surface of the first area.

Additional aspects and advantages of the present invention will be set forth in part in the description which follows, and in part will be obvious from the description, or may be learned by practice of the invention.

DETAILED DESCRIPTION

Figure 1:
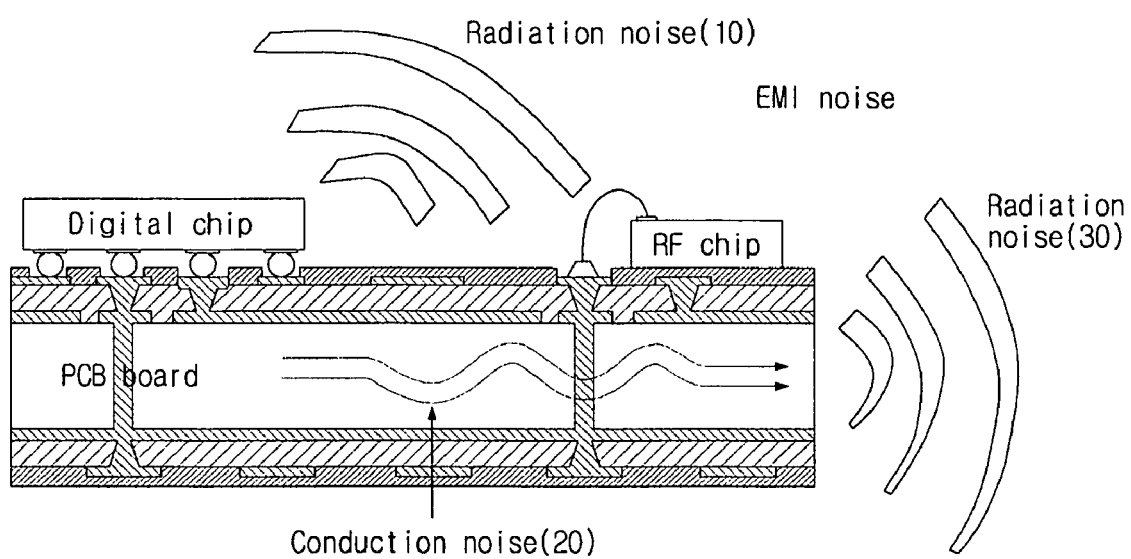
FIG. 1 shows a noise radiated from a printed circuit board on which an electronic component is mounted.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

In the description of the present invention, certain detailed explanations of related art are omitted when it is deemed that they may unnecessarily obscure the essence of the invention. While such terms as "first" and "second," etc., may be used to describe various components, such components must not be limited to the above terms. The above terms are used only to distinguish one component from another.

An EMI noise reduction printed circuit board according to an embodiment of the present invention is not for shielding a "conduction noise" inside the board but for shielding a radiation noise, which is radiated towards the outside of the board when the radiation noise is conducted to the edge of the board. For this, a printed circuit board according to the present embodiment includes a first area 100, in which a ground layer 110 and a power layer 120 are formed, and a second area 200, which is placed on a side surface of the first area 100 and in which an electromagnetic bandgap structure ("EBG structure" hereinafter) is formed therein. Here, the EBG structure includes a plurality of first conductive plates 210, which are placed along the side surface of the first area 100, a plurality of second conductive plates 220, which are disposed on a planar surface that is different from the first conductive plates 210 such that the second conductive plates 220 are alternatively disposed with the first conductive plates 210, and vias 250 and 250a, which connect the first conductive plates 210 to the second conductive plates 220.

Such conductive plates 210 and 220 form a capacitance component with a dielectric body (not shown), which is interposed between them, and the vias 250 form an inductance component. By the combination of the capacitance component and the inductance component, the EBG structure, i.e., an L-C filter, can be formed.

Figure 2:
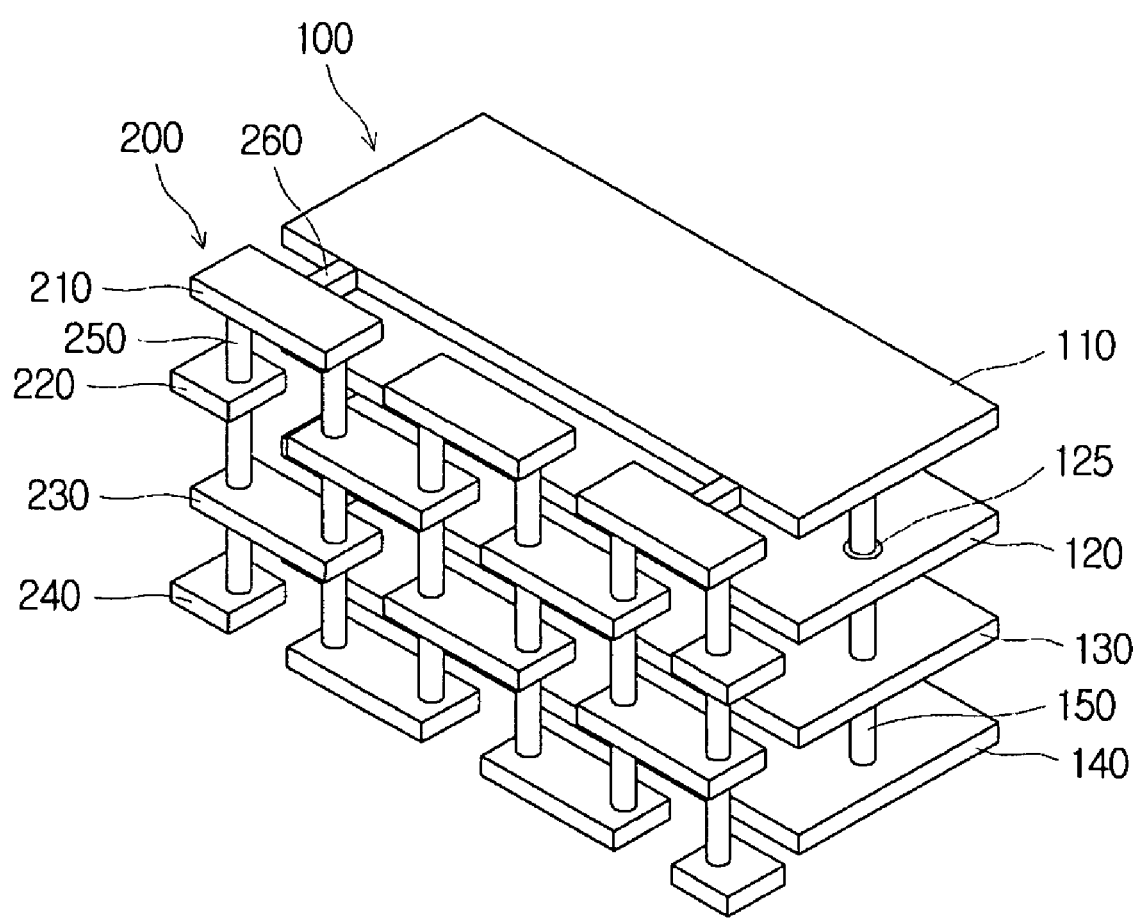
FIG. 2 is a perspective view of an EMI noise reduction printed circuit board in accordance with an embodiment of the present invention.

In other words, as illustrated in FIG. 2, the printed circuit board according to the present embodiment forms conductive plates 210, 220, 230 and 240, which are separated from one another and placed at the edge of the board, and has a structure in which an EMI noise radiated form the edge of the board to the side surface thereof can be shield by alternatively disposing the conductive plates and connecting them through the vias 250 to one another.

The ground layer 110, the power layer 120 and the like are formed in the first area 100. FIG. 2 shows that the ground layer 110 is formed on a top layer of the first area 100, and the power layer 120 is formed below the top layer. Two layers 130 and 140, which are formed below the power layer 120, are grounded to the ground layer 110 through the via 150. A clearance hole 125 is formed at the power layer 120 to electrically separate the power layer 120 from the via 150. An insulator (not shown) or dielectric body is interposed between the layers.

However, the configuration of the first area 100 described above is only one example, and it shall be apparent that the structure and arrangement of the first area 100 can be changed variously.

Figure 3:
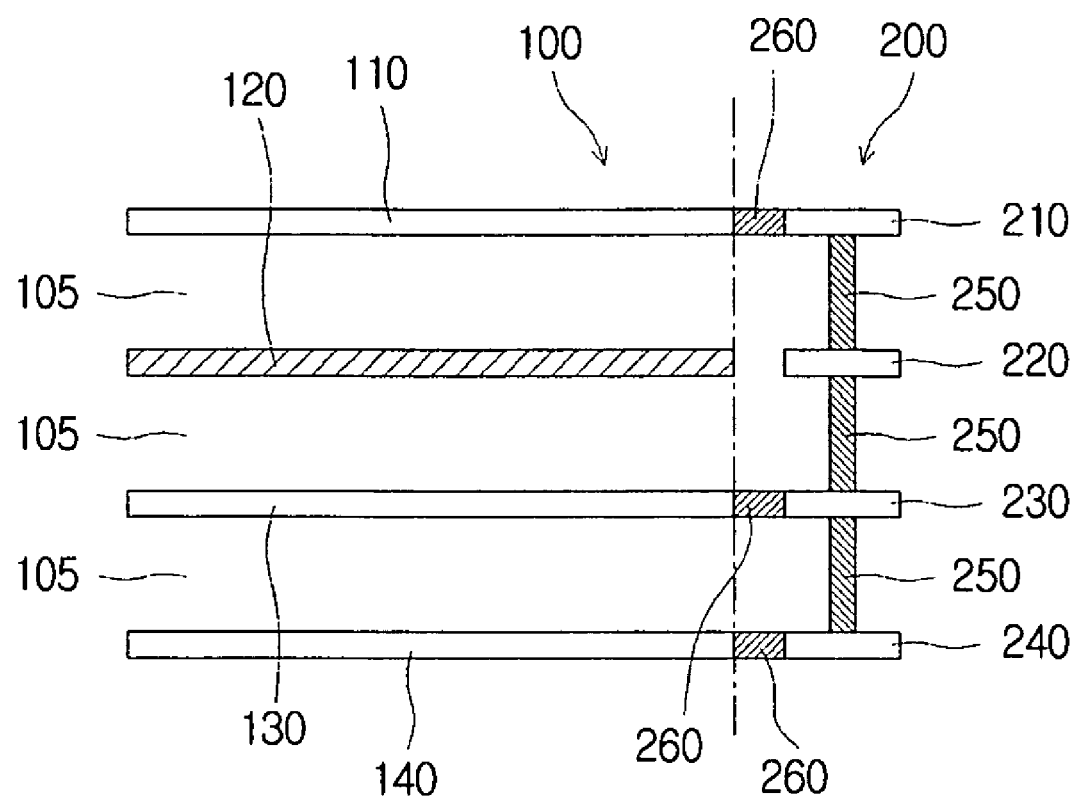
FIG. 3 is a side view of an EMI noise reduction printed circuit board in accordance with an embodiment of the present invention.
Figure 4:
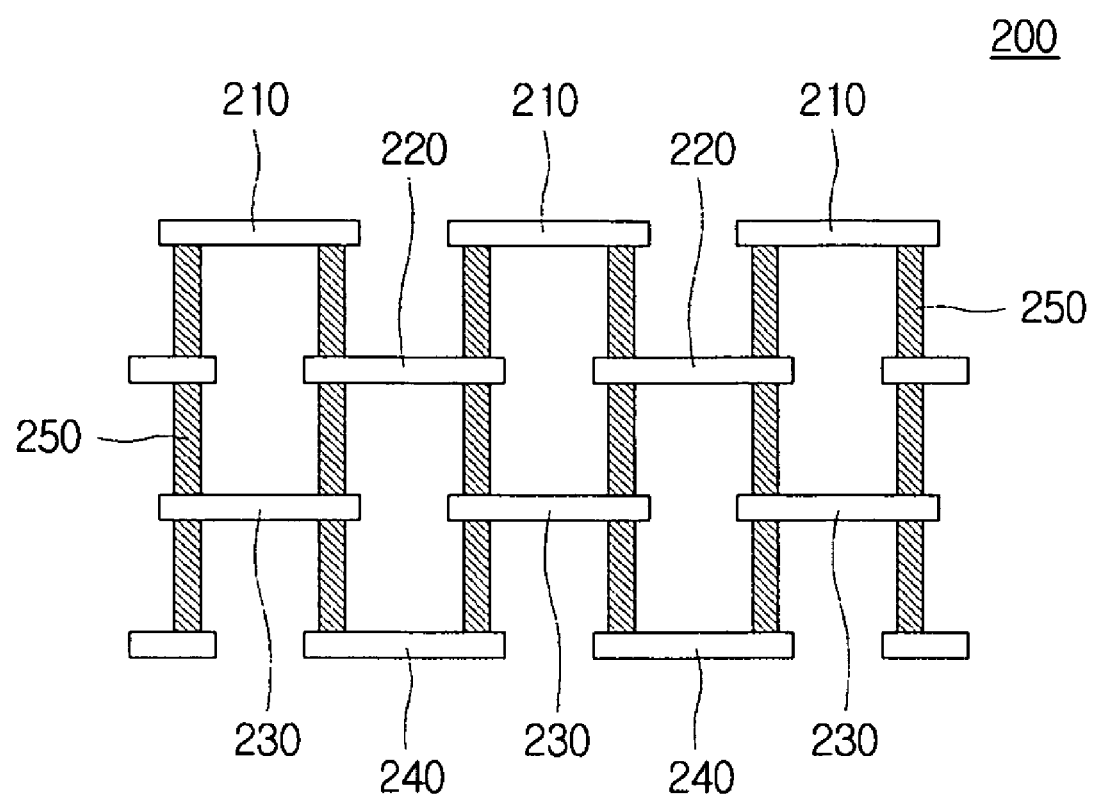
FIG. 4 is a front view of an EMI noise reduction printed circuit board in accordance with an embodiment of the present invention.

The second area 200 placed next to the first area 100, in which the ground layer 110 and the power layer 120 are formed, has a plurality of conductive plates 210, 220, 230 and 240 that are alternately arranged vertically, as illustrated in FIGS. 3 and 4, which are side and front views, respectively, of the printed circuit board according to the present embodiment. More specifically, the plurality of first conductive plates 210 are disposed on a same planar surface along a side surface of the first area 100, and the second conductive plates 220 are disposed on a planar surface that is different from the planar surface on which the first conductive plates 210 are disposed, along the side surface of the first area 100. Here, the second conductive plates 220 and the first conductive plates 210 are alternately arranged. That is, both end parts of the first conductive plates 210 and the second conductive plates 220 are partly overlapped with one another. In this way, the overlapped end parts of the first conductive plates 210 and the second conductive plates 220 are connected to one another through the vias 250.

It is to be noted that the first conductive plates and the second conductive plates are not referred to as conductive plate that performs a specific function, but for distinguishing the conductive plates 210, 220, 230 and 240 disposed on different planar surfaces from one another. Moreover, although the conductive plates 210, 220, 230 and 240 have a same size and shape, it is also possible that the conductive plates 210, 220, 230 and 240 have different sizes and shapes, as required in the design.

Although it is not illustrated, an insulator or dielectric body for interlayer insulation is interposed between the conductive plates 210, 220, 230 and 240.

Meanwhile, as illustrated in FIGS. 2 to 4, the first area 100 and the second area 200 can be formed as a multi-layered structure with at least four layers, and the vias are penetration vias 250 that penetrate through the second area 200 vertically. If the second area 200 is formed with a number of layers, the interlayer connection can be implemented more readily by forming the penetration vias 250 on overlapped portions because any one of the conductive plates 210, 220, 230 and 240 placed on one layer is partially overlapped with another one of the conductive plates 210, 220, 230 and 240 placed on another layer. Accordingly, the manufacturing process can become simpler, reducing the overall manufacturing cost.

Meanwhile, as illustrated in FIGS. 2 and 3, the first conductive plate 210 can be electrically connected to the first area 100, more specifically, to the ground layer 110, through an access line 260. As such, if the first conductive plates 210 are connected to the ground layer 110, the ground can be obtained more widely, thus improving the noise shielding effect.

Figure 5:
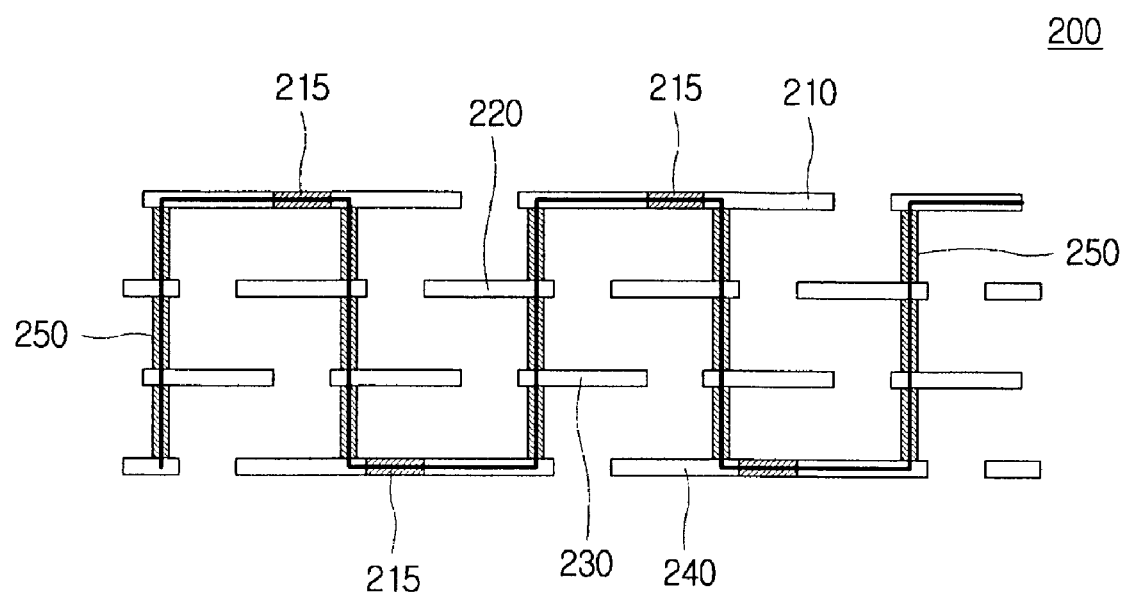
FIGS. 5 to 22 are front views illustrating an EMI noise reduction printed circuit board in accordance with various embodiments of the present invention.
Figure 6:
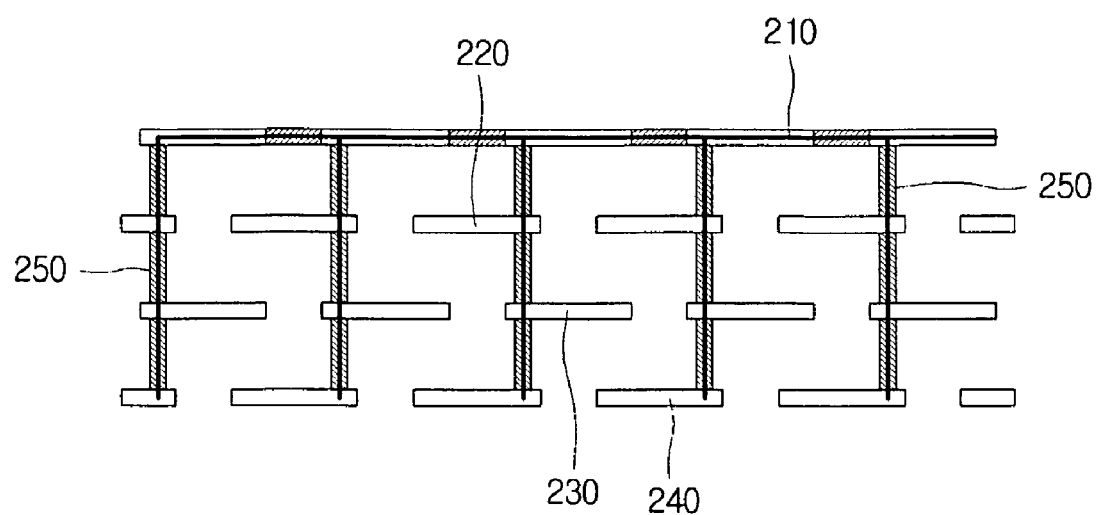
Figure 7:
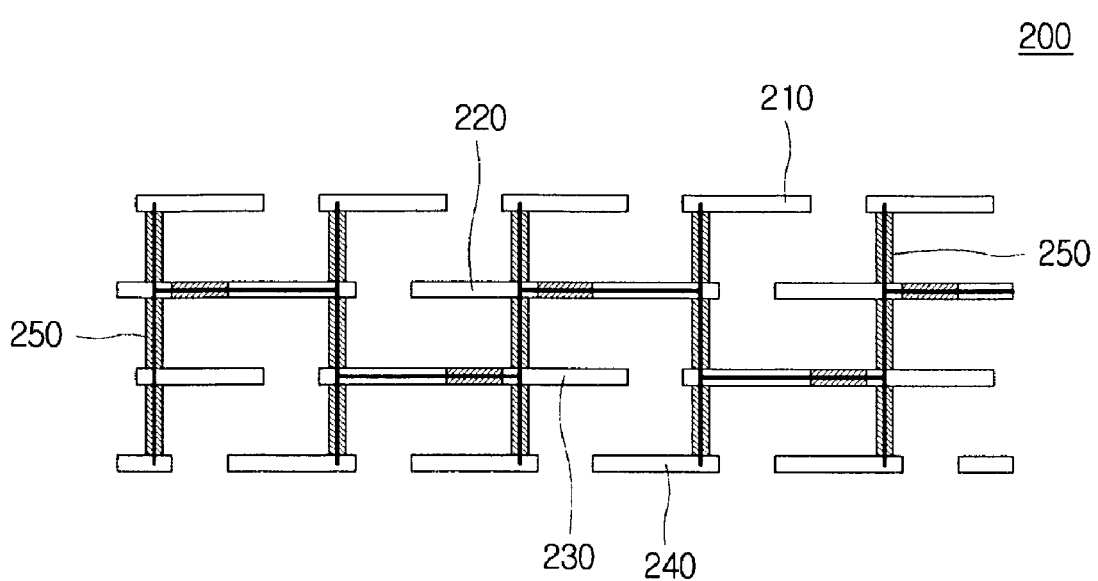

FIGS. 5 to 10 show various modification examples of the EBG structure being inserted into the second area 200. As illustrated in FIG. 5, at least one adjacent pair of the plurality of first conductive plates 210 can be electrically connected by a connection line 215 to each other. By forming the connection line 215 between adjacent first conductive plates 210, an inductive component can be added between the first conductive plates 210, thus improving the design freedom for shielding the noise more efficiently. In the examples of the EBG structures illustrated in FIGS. 5 to 7, all conductive plates arranged in the second area 200 are electrically connected to one another by the penetration vias 250 and the connection lines 215 within the second area 200.

Figure 8:
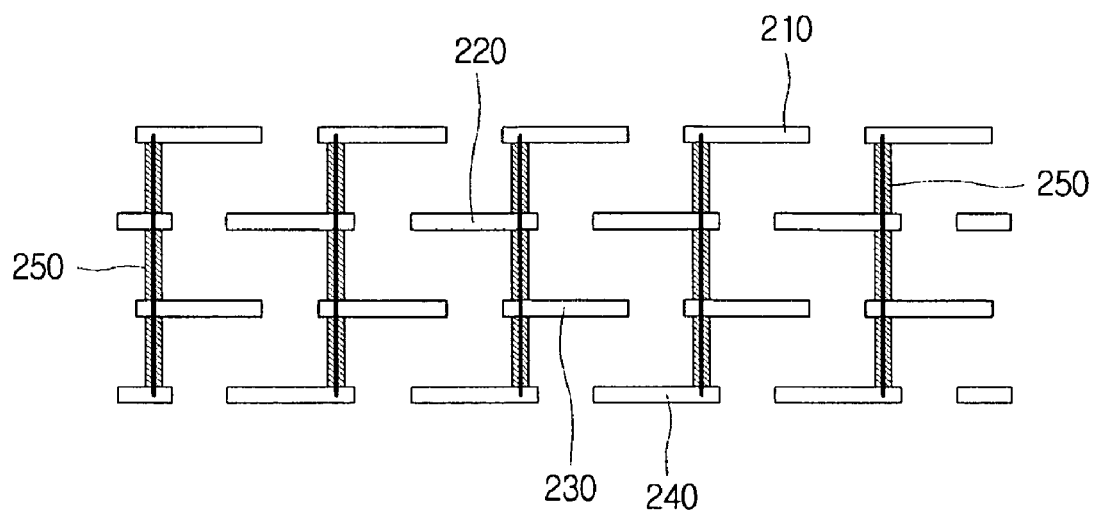
Figure 9:
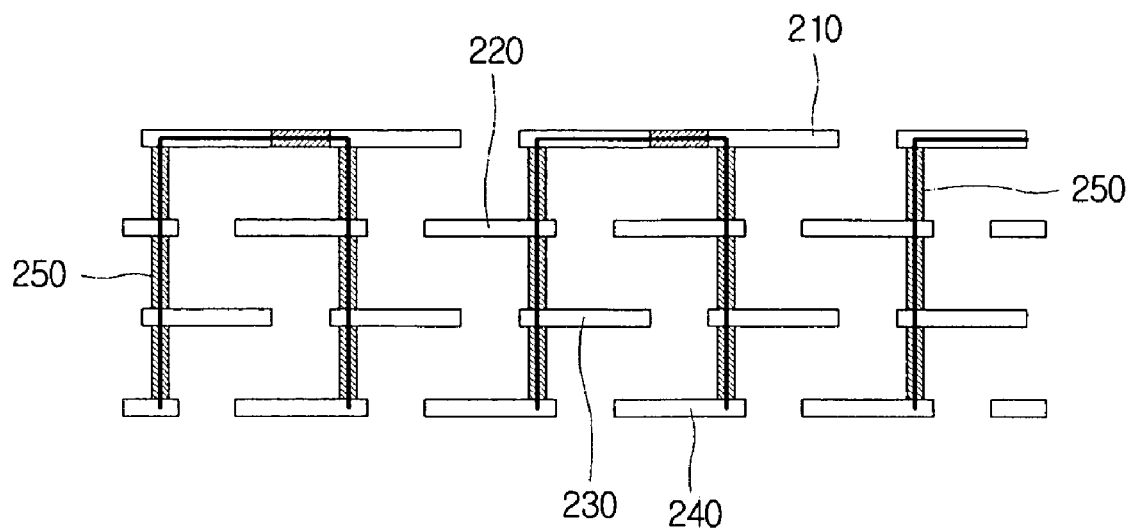
Figure 10:
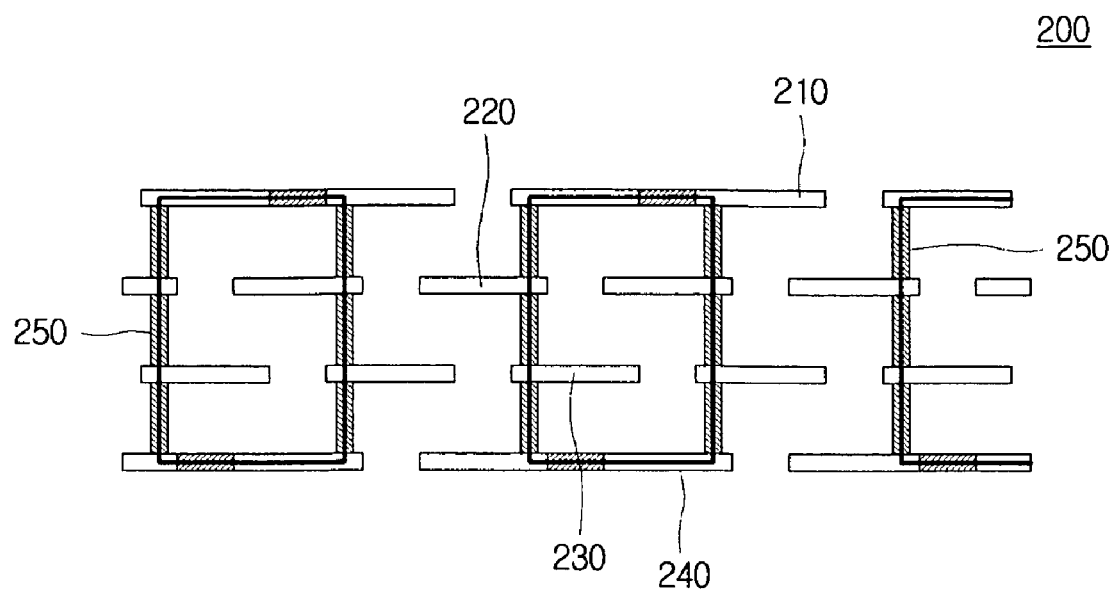

Meanwhile, in the examples of the EBG structure shown in FIGS. 8 to 10, some conductive plates form independent paths, and each of such conductive plates is connected by at least one access line 260 to the ground layer 110 of the first area 100.

Figure 11A:
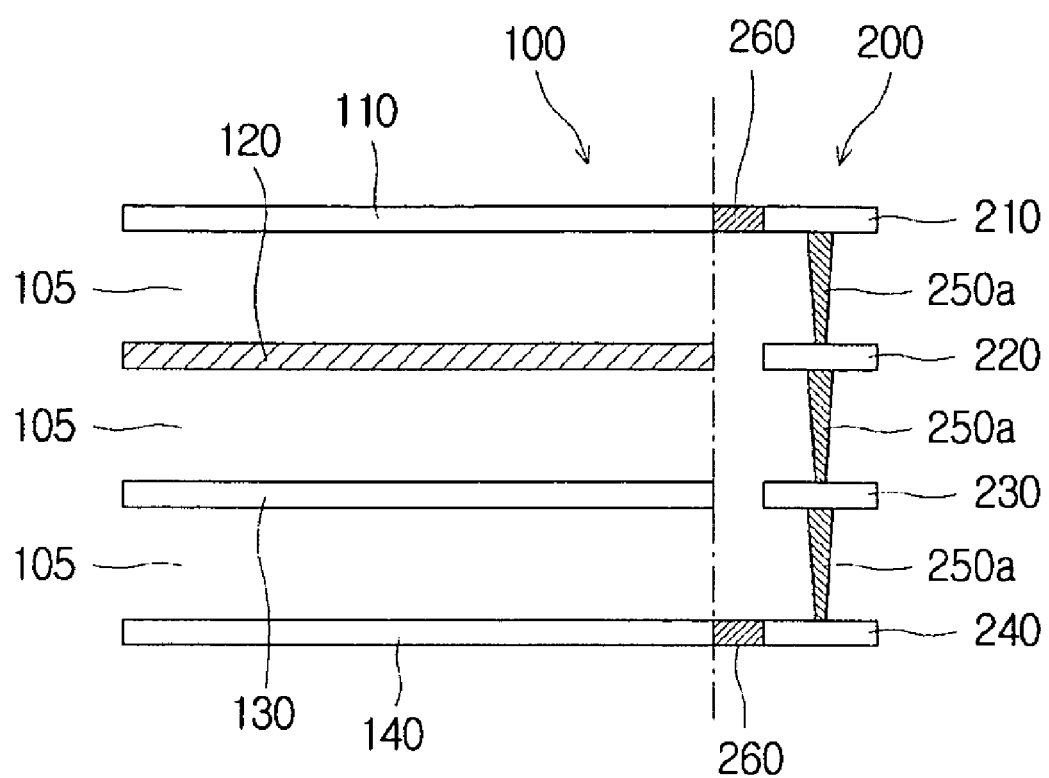
Figure 11B:
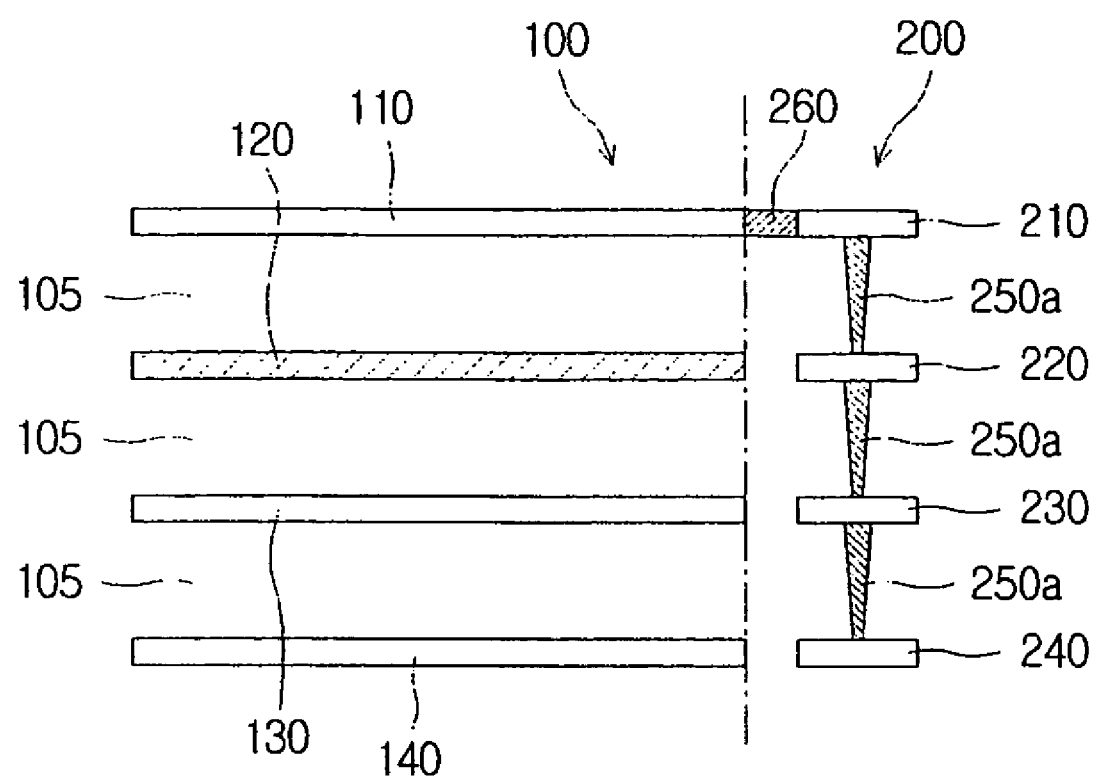
Figure 12:
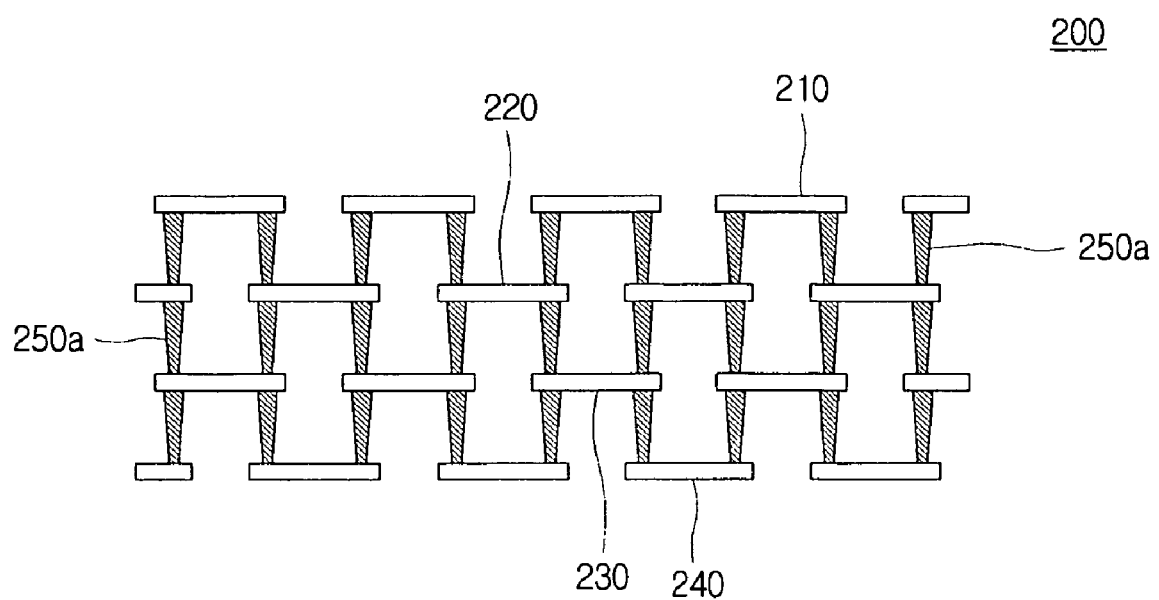
Figure 13:
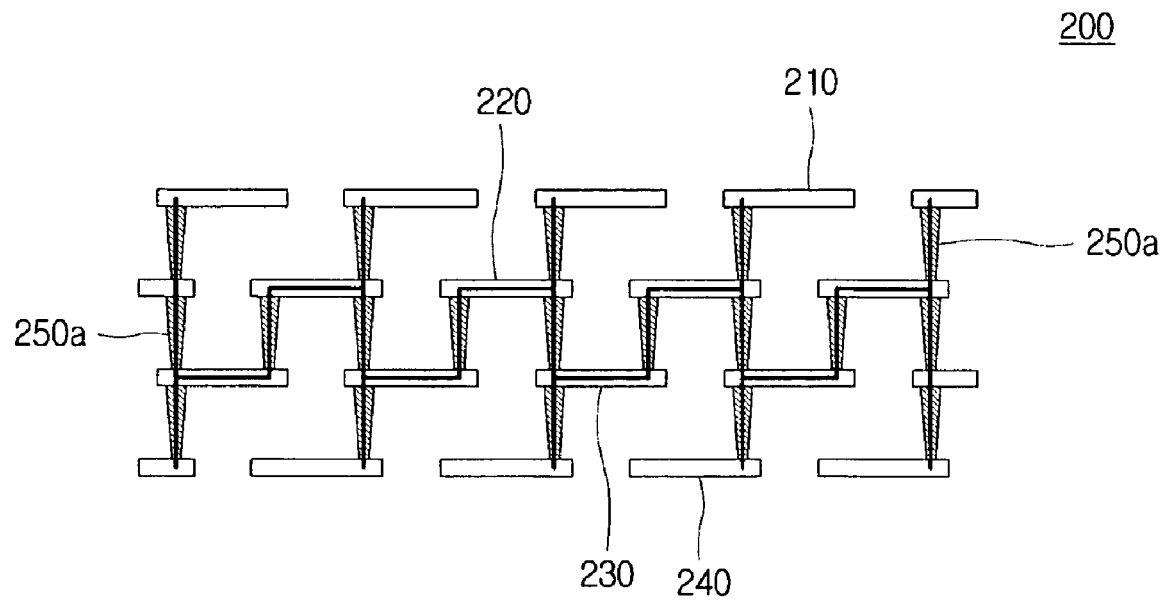
Figure 14:
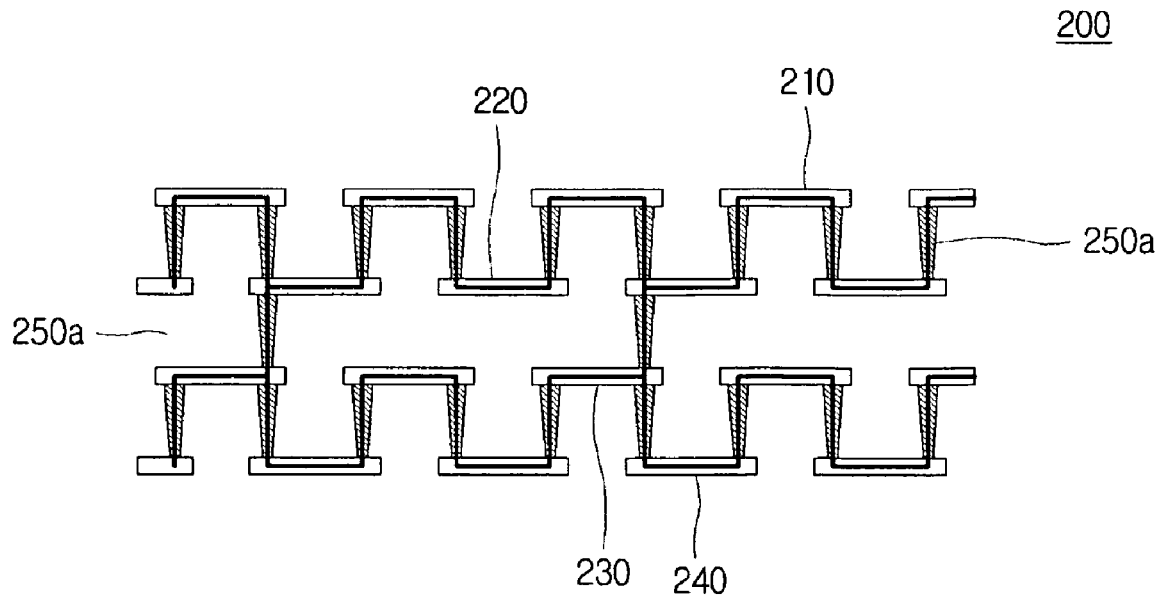
Figure 15:
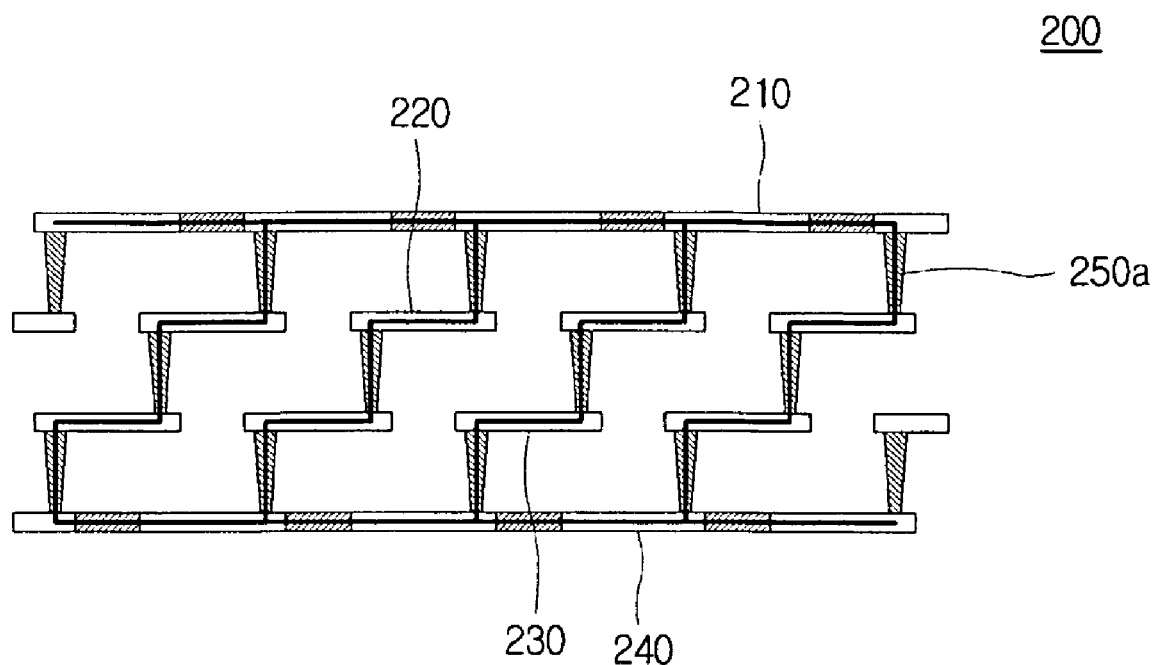
Figure 16:
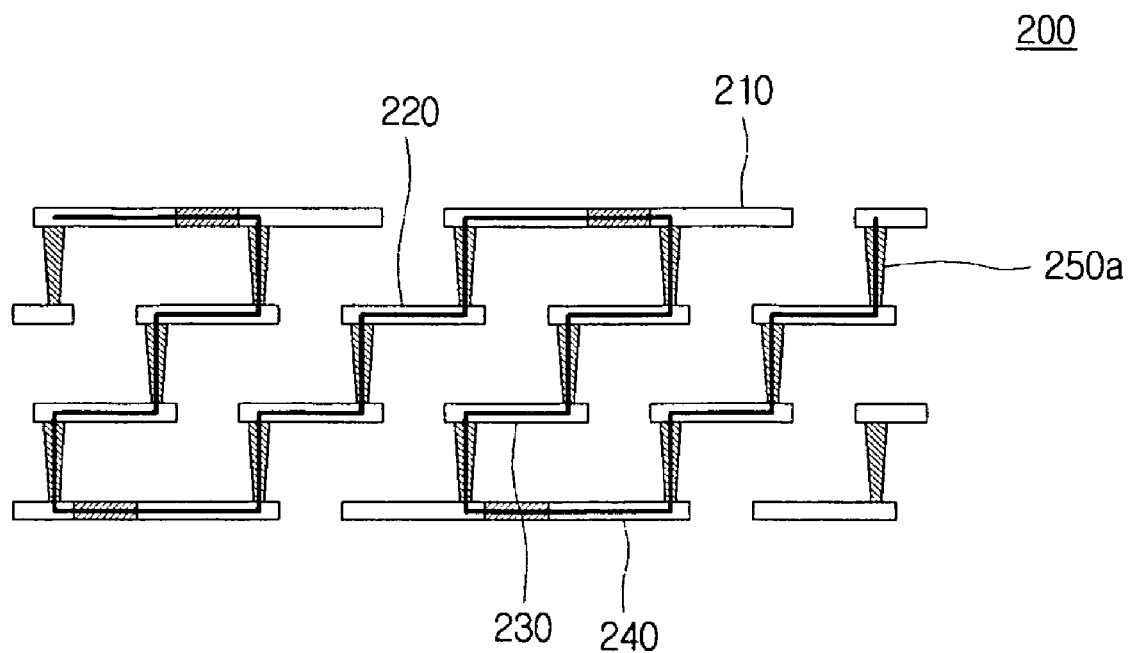
Figure 17:
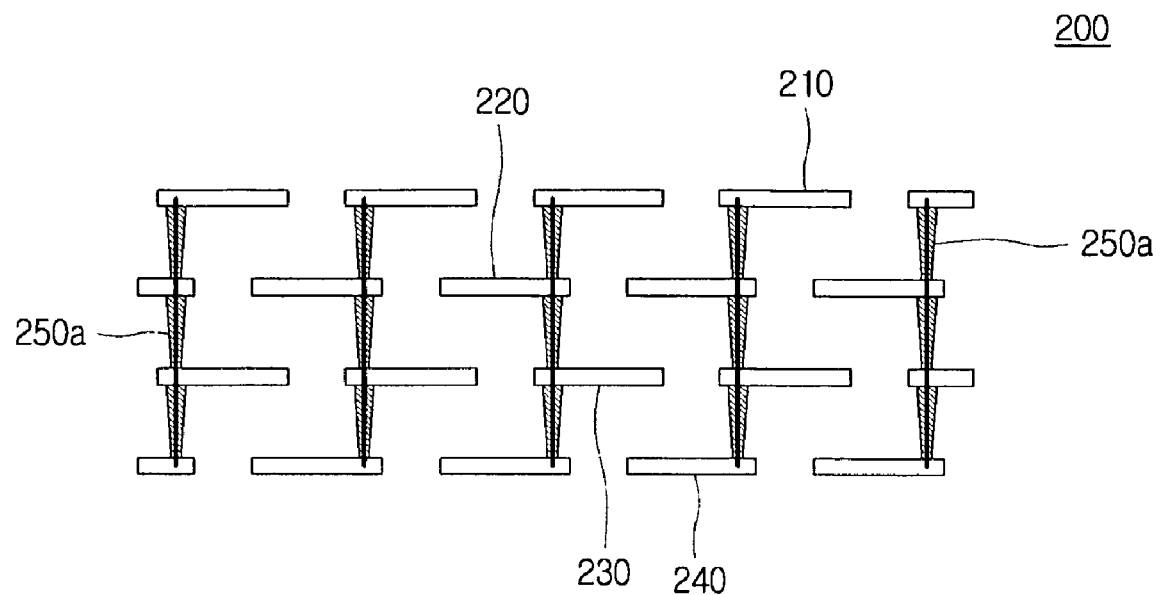
Figure 18:
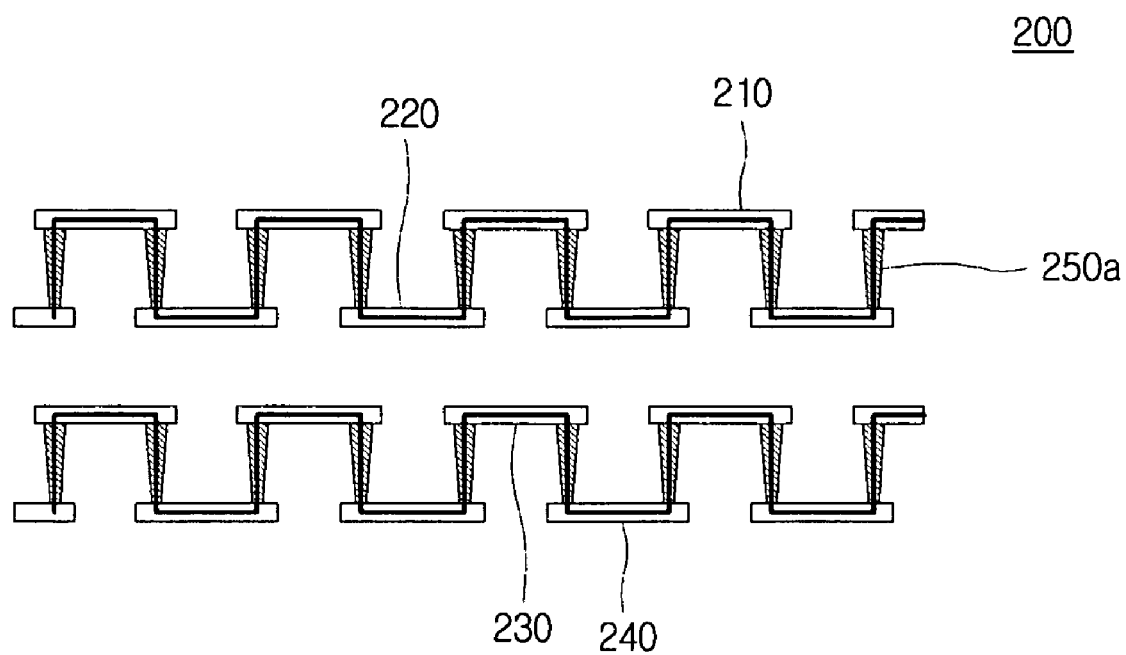
Figure 19:
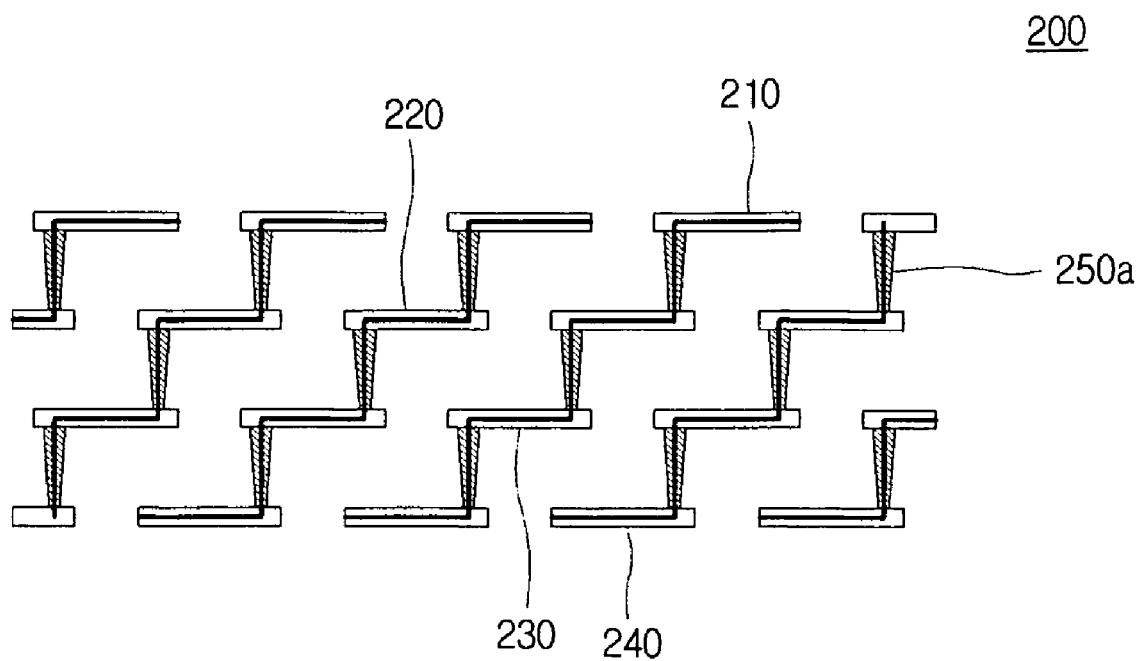
Figure 20:
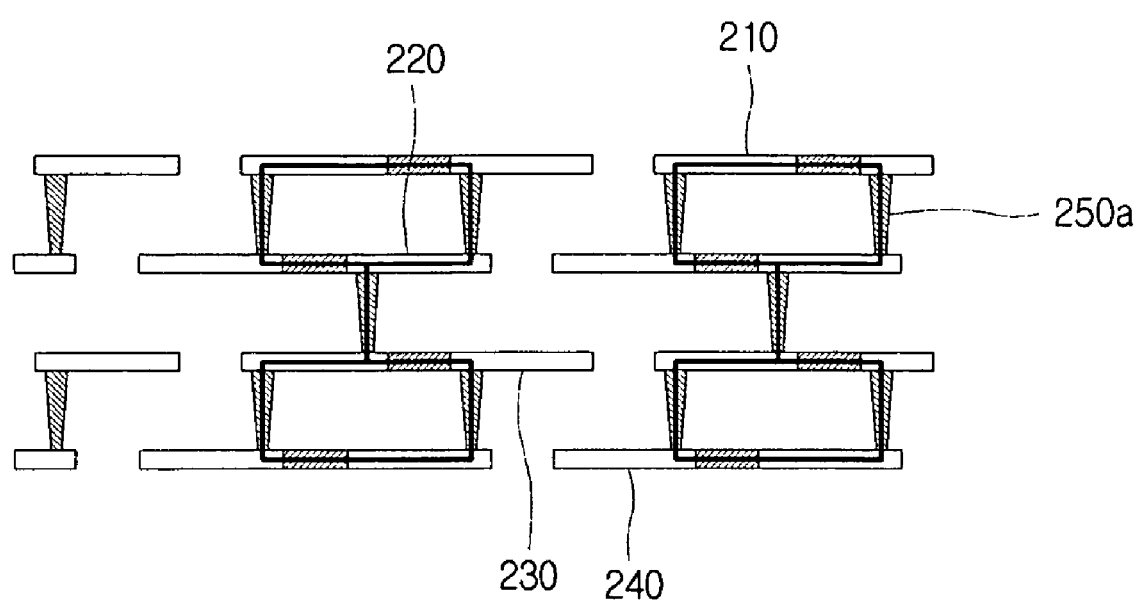
Figure 21:
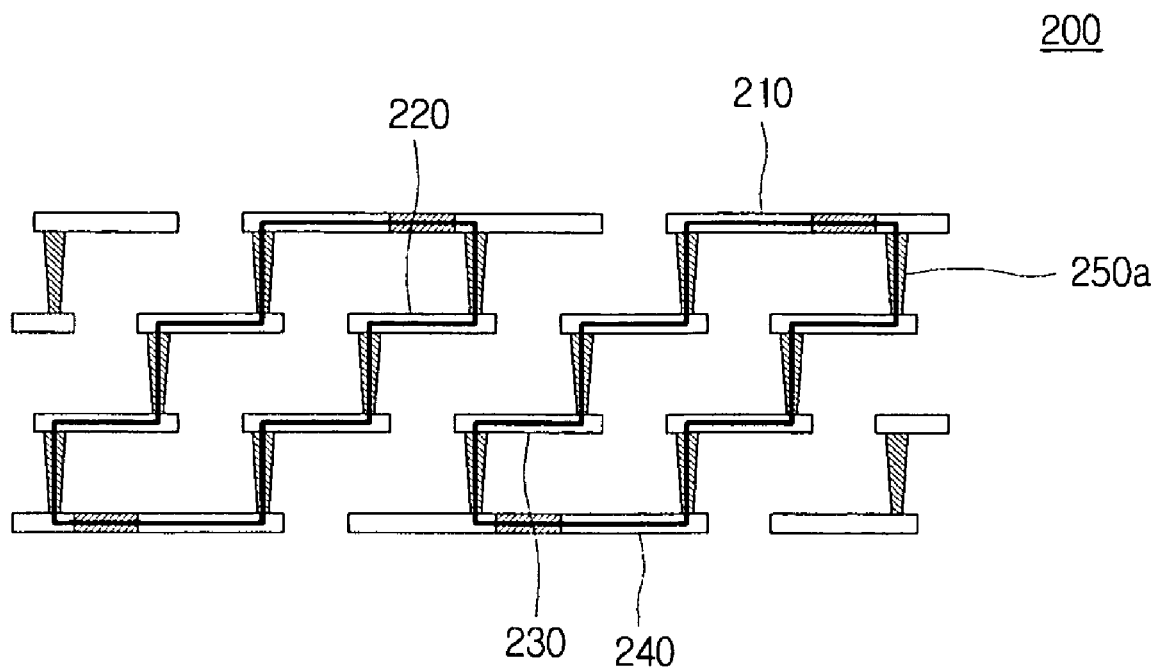
Figure 22:
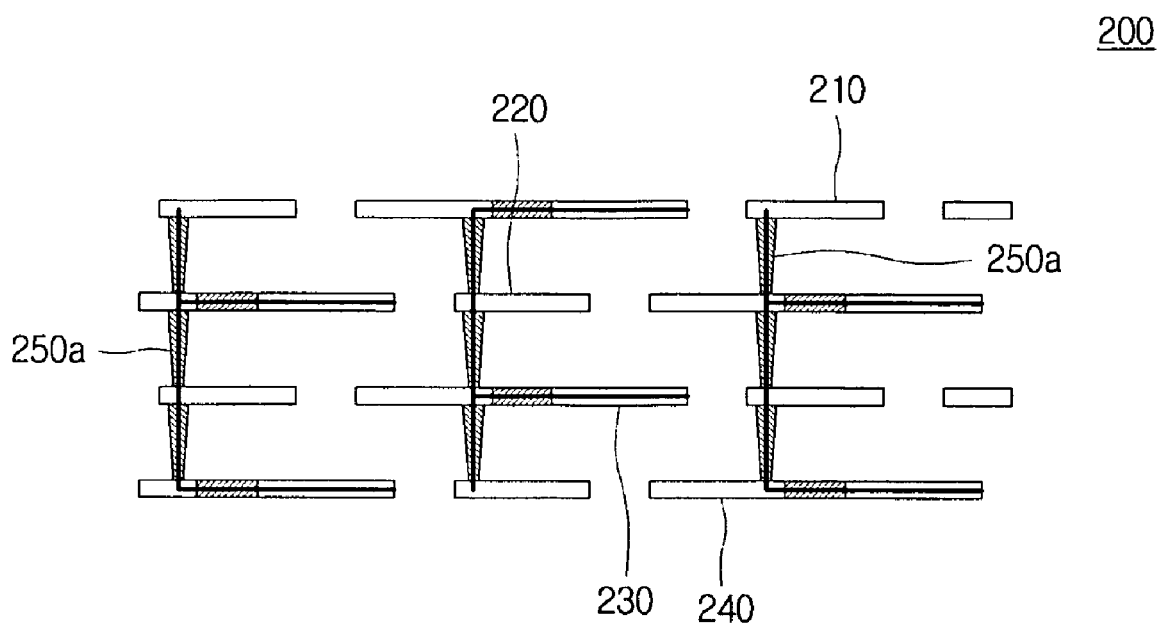

Although the previously described embodiments have disclosed the respective structures in which the conductive plates 210, 220, 230 and 240 formed in the second area 200 are electrically connected to one another by the penetration vias 250 penetrating through the second area 200, they can be individually connected to one another by blind vias 250a, as illustrated in FIGS. 11A to 22. As illustrated in FIGS. 11A and 11B, the first conductive plate 210 can be connected by the access line 260 to the ground layer 110 of the first area 100, and in some cases, another conductive plate 240 can also be connected by the access line 260 to the first area 100, as illustrated in FIG. 11A.

In the EBG structures shown in FIGS. 12 to 16, all of the conductive plates 210, 220, 230 and 240 formed in the second area 200 are electrically connected by the blind vias 250a and the connection lines 215 to one another within the second area 200.

In the EBG structures shown in FIGS. 17 to 22, some conductive plates form an independent paths by using the connection lines 215 and/or the blind vias 250a, and each of the independent paths is connected by at least one access line 260 to the ground layer 110 of the first area 100.

Figure 23:
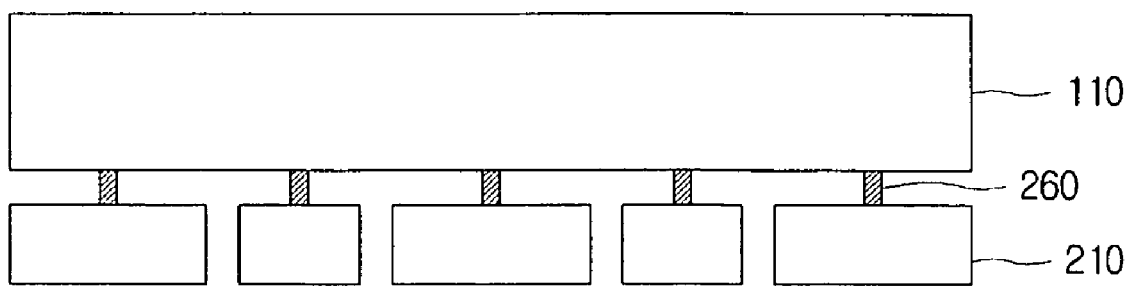
FIGS. 23 to 26 are plan views illustrating an EMI noise reduction printed circuit board in accordance with various embodiments of the present invention.
Figure 24:
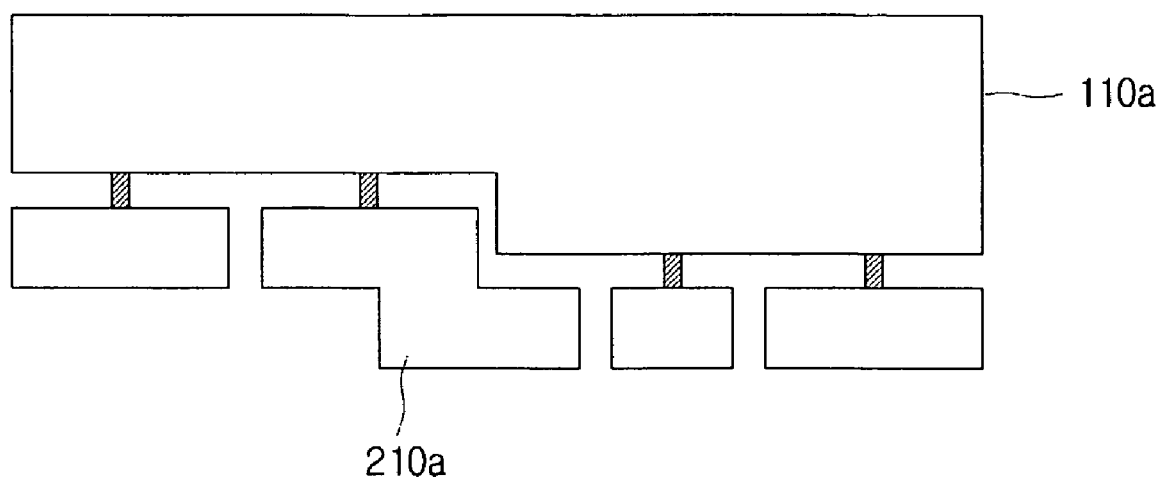
Figure 25:
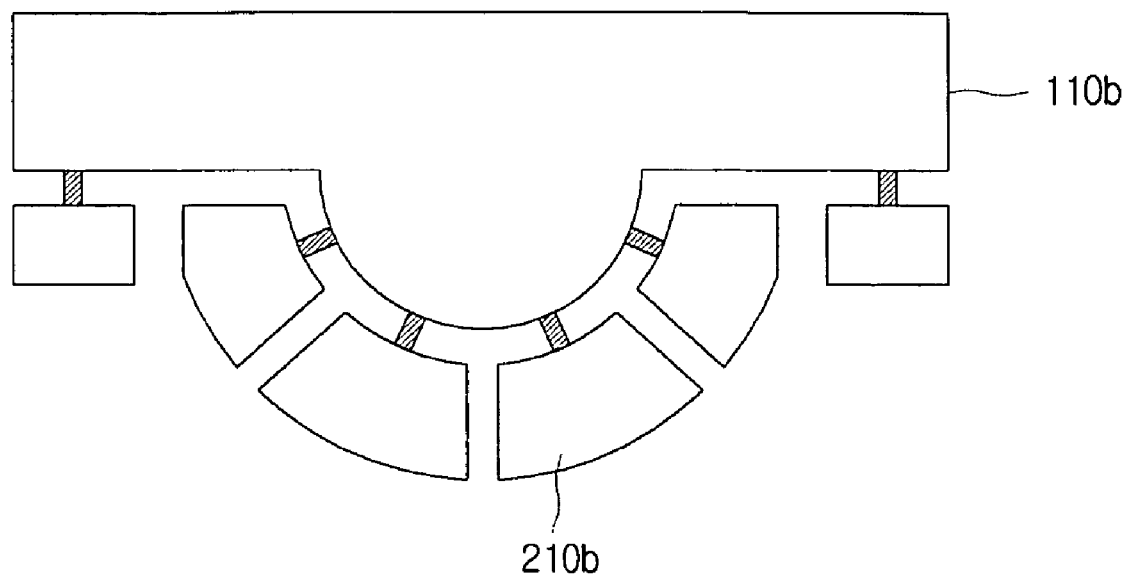
Figure 26:
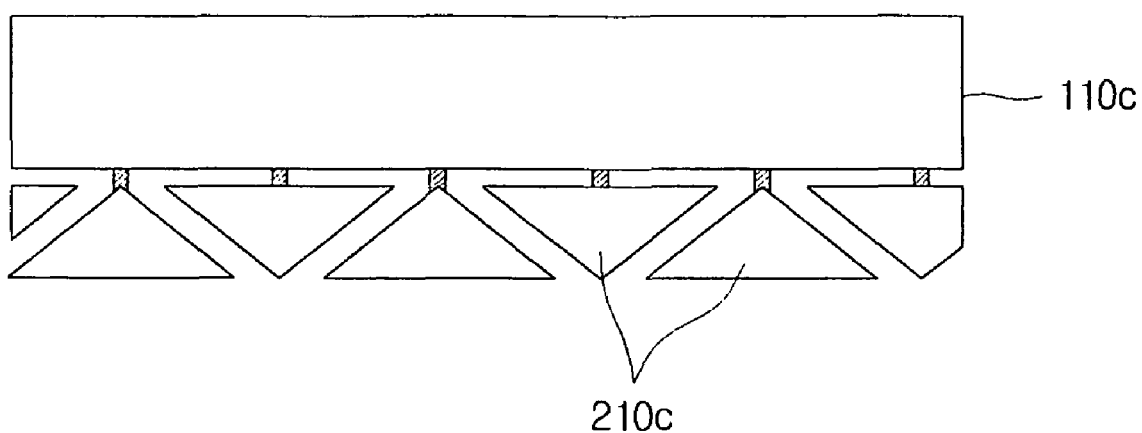

Meanwhile, as illustrated in FIG. 23, if a side surface of the first area 100 has a rectangular shape, the first conductive plates 210 and/or the second conductive plates 220 of the second area 200 can also have rectangular shapes. However, as illustrated in FIGS. 24 and 25, if the first area 100 has a shape other than the rectangular shape, the first conductive plates 210 and/or the second conductive plates 220 of the second area 200 can also have a shape corresponding to the shape of the first area 100. That is, as illustrated in FIG. 24, the first conductive plates 210 can have a bent shape, or as illustrated in FIG. 25, it can have a curved shape, or as illustrated in FIG. 26, it can have a triangular shape.

Meanwhile, even though the second area 200 into which the EBG structure is inserted can be disposed on an entire side surface of the first area 100, it can be selectively disposed on a certain portion only. As such, a noise in a certain portion desired by the user can be selectively shielded by selectively disposing the second area 200 on the certain portion only, and thus it can be expected that the cost to manufacture can be saved.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

As such, many embodiments other than those set forth above can be found in the appended claims.

What is claimed is:

1. An EMI noise reduction printed circuit board, having an electromagnetic bandgap structure with band stop frequency properties inserted into an inner portion of the board, the EMI noise reduction printed circuit board being a multi-layered printed circuit board, the EMI noise reduction printed circuit board comprising:
a first area, in which a ground layer and a power layer are formed; and
a second area placed on a side surface of the first area, the second area having the electromagnetic bandgap structure formed therein so as to shield an EMI noise radiated to the outside of the board through the side surface of the first area,
wherein the electromagnetic bandgap structure comprises:
a plurality of first conductive plates placed along the side surface of the first area;
a plurality of second conductive plates disposed on a planar surface that is different from the first conductive plates such that the second conductive plates are alternately disposed with the first conductive plates; and
a via configured to connect the first conductive plates to the second conductive plates.

2. An EMI noise reduction printed circuit board, having an electromagnetic bandgap structure with band stop frequency properties inserted into an inner portion of the board, the EMI noise reduction printed circuit board being a multi-layered printed circuit board, the EMI noise reduction printed circuit board comprising:
a first area formed as a multi-layered structure having at least four layers, including a ground layer and a power layer; and
a second area having a multi-layered structure corresponding to the respective layers of the first area, the second area being placed on a side surface of the first area, the second area having the electromagnetic bandgap structure formed therein so as to shield an EMI noise radiated to the outside of the board through the side surface of the first area,
wherein the electromagnetic bandgap structure comprises
a plurality of first conductive plates placed along the side surface of the first area;
a plurality of second conductive plates disposed on a planar surface that is different from the first conductive plates such that the second conductive plates are alternately disposed with the first conductive plates; and
a via configured to connect the first conductive plates to the second conductive plates, the via being a penetration via penetrating through the second area vertically.

3. The EMI noise reduction printed circuit board of claim 1, wherein the via is a blind via.

4. The EMI noise reduction printed circuit board of claim 1, wherein at least one of the first conductive plates and the second conductive plates has a bent shape corresponding to the shape of the edge of the first area.

5. The EMI noise reduction printed circuit board of claim 1, wherein at least one adjacent pair of the plurality of first conductive plates are electrically connected to each other through a connection line.

6. The EMI noise reduction printed circuit board of claim 1, wherein the first conductive plates are electrically connected to the ground layer through an access line.

7. The EMI noise reduction printed circuit board of claim 1, wherein the second area is selectively disposed only on a portion of the side surface of the first area.

* * * * *

UNITED STATES PATENT AND TRADEMARK OFFICE
CERTIFICATE OF CORRECTION

| | |
|---|---|
| PATENT NO. | : 8,258,408 B2 |
| APPLICATION NO. | : 12/654545 |
| DATED | : September 4, 2012 |
| INVENTOR(S) | : Han Kim et al. |

It is certified that error appears in the above-identified patent and that said Letters Patent is hereby corrected as shown below:

Title page, item [30] under Foreign Patent Documents, add JP 2007-208013 08/16/2007.
Item [56] under Other Publications, add Japanese Office Action mailed July 17, 2012 issued in corresponding Japanese Patent Application No. 2009-293154.

Signed and Sealed this
Twelfth Day of February, 2013

Teresa Stanek Rea
*Acting Director of the United States Patent and Trademark Office*